United States Patent
Chen et al.

(10) Patent No.: US 9,378,692 B2
(45) Date of Patent: Jun. 28, 2016

(54) GATE DRIVING CIRCUIT AND METHOD, AND LIQUID CRYSTAL DISPLAY

(71) Applicant: BEIJING BOE OPTOELECTRONICS TECHNOLOGY CO., LTD., Beijing (CN)

(72) Inventors: Xi Chen, Beijing (CN); Wenhai Cui, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 312 days.

(21) Appl. No.: 13/884,713

(22) PCT Filed: Nov. 23, 2012

(86) PCT No.: PCT/CN2012/085194
§ 371 (c)(1),
(2) Date: May 10, 2013

(87) PCT Pub. No.: WO2013/143307
PCT Pub. Date: Oct. 3, 2013

(65) Prior Publication Data
US 2014/0111413 A1    Apr. 24, 2014

(30) Foreign Application Priority Data

Mar. 29, 2012   (CN) .......................... 2012 1 0089393

(51) Int. Cl.
*G11C 19/28*   (2006.01)
*G09G 3/36*    (2006.01)

(52) U.S. Cl.
CPC ............ *G09G 3/3611* (2013.01); *G09G 3/3677* (2013.01); *G11C 19/28* (2013.01); *G09G 2310/0286* (2013.01); *G09G 2320/0223* (2013.01); *G09G 2320/041* (2013.01)

(58) Field of Classification Search
CPC .............................. G11C 19/28; G09G 3/3611
See application file for complete search history.

(56) References Cited

U.S. PATENT DOCUMENTS

2004/0150610 A1 * 8/2004 Zebedee et al. ............... 345/100
2004/0189585 A1   9/2004 Moon
(Continued)

FOREIGN PATENT DOCUMENTS

CN    102012591 A    4/2011
CN    102013244 A    4/2011
(Continued)

OTHER PUBLICATIONS

First Chinese Office Action Appln. No. 201210089393.9; Dated Aug. 26, 2014.
(Continued)

*Primary Examiner* — Kathy Wang-Hurst
*Assistant Examiner* — Peijie Shen
(74) *Attorney, Agent, or Firm* — Ladas & Larry LLP

(57) ABSTRACT

The present disclosure provides a gate driving circuit, a gate driving method and a liquid crystal display. Said gate driving circuit includes shift registers at a plurality of stages, wherein the shift register at each stage includes a pull-up driving unit, a pull-up unit, a reset unit, a pull-down unit and a supplementary unit; said pull-up unit is used for making a clock signal at a first clock terminal an output signal of the shift register at the present stage when being turned on; said supplementary unit, connected to said pull-up unit, is used for making a clock signal at a second clock terminal the output signal of the shift register at the present stage when being turned on. With the supplementary unit, the present disclosure can reduce voltage jump of a pixel, achieve the MLG function and enhance the picture quality of the LCD.

20 Claims, 4 Drawing Sheets

(56) References Cited

U.S. PATENT DOCUMENTS

| | | |
|---|---|---|
| 2008/0036725 A1 | 2/2008 | Lee et al. |
| 2008/0080661 A1* | 4/2008 | Tobita .............................. 377/78 |
| 2008/0100560 A1 | 5/2008 | Na et al. |
| 2010/0141570 A1 | 6/2010 | Horiuchi et al. |
| 2010/0177068 A1 | 7/2010 | Shih et al. |
| 2011/0058640 A1 | 3/2011 | Shang et al. |
| 2011/0234565 A1* | 9/2011 | Morii et al. ................... 345/211 |
| 2012/0044132 A1 | 2/2012 | Koga et al. |

FOREIGN PATENT DOCUMENTS

| | | |
|---|---|---|
| CN | 102779494 A | 11/2012 |
| JP | 2010-160472 A | 7/2010 |
| KR | 20020057026 A | 7/2002 |
| KR | 20020091451 A | 12/2002 |
| KR | 20040082492 A | 9/2004 |
| KR | 100495798 B1 | 6/2005 |
| KR | 1020060021532 A | 3/2006 |
| KR | 20080039026 A | 5/2008 |
| KR | 20110025630 A | 3/2011 |

OTHER PUBLICATIONS

International Preliminary Report on Patentability Appln. No. PCT/CN2012/085194; Dated Oct. 1, 2014.

International Search Report mailed Jul. 3, 2013; PCT/CN2012/085194.

Korean Office Action dated Mar. 31, 2014: Appln. No. 10-2013-7012244.

Korean Office Action dated Oct. 29, 2014; Appln. No. 10-2013-7012244.

Second Chinese Office Action dated Mar. 23, 2015; Appln. No. 201210089393.9.

Korean Notice of Allowance dated Apr. 27, 2015; Appln. No. 10-2013-7012244.

Extended European Search Report dated Dec. 5, 2015; Appln. No. 12842680.6-1903/2667376 PCT/CN2012085194.

\* cited by examiner

GATE DRIVING CIRCUIT AND METHOD, AND LIQUID CRYSTAL DISPLAY

TECHNICAL FIELD OF THE DISCLOSURE

The present disclosure relates to the technical field of gate driving, and in particular relates to a gate driving circuit, a gate driving method and a liquid crystal display (LCD).

BACKGROUND

The LCD is a commonly-used panel display, wherein the Thin Film Transistor Liquid Crystal Display (TFT-LCD) is the mainstream product in the current liquid crystal displays. With the increasingly fierce competition in the TFT-LCD products, the manufacturers have to reduce the cost of their products by using new techniques, so as to enhance the market competitiveness of the products. Wherein, GOA (Gate on Array) technique refers to integrating a gate driver of TFT-LCD on an array substrate, thereby forming a scan driving of the panel. Compared with the traditional COF (Chip On Flex/Film) process and the COG (Chip On Glass) process, it not only can save cost, but also can achieve a beautiful design of symmetry of both sides, leaving out binding region and fan-out wiring space of a gate integrated circuit (Gate IC), thereby achieving a narrow border design. At the same time, a Gate direction binding process can be saved, which is more favorable for enhancing the productivity and yield.

However, compared to the COF and COG techniques, GOA technique also has some problems. An existing gate driving circuit includes shift registers at a plurality of stages, and FIG. 1 is a structure diagram of the shift register at each stage in the existing gate driving circuit. As shown in FIG. 1, said shift register at each stage comprises a first TFT switching device M1, a second TFT switching device M2, a third TFT switching device M3, a fourth TFT switching device M4, a pull-down unit PD and a boost device C1; wherein a drain and a gate of M1 is connected to an input terminal (INPUT), and receives an output signal of the shift register at a previous stage; a drain of M2 is connected to a source of M1, a gate of M2 is connected to a reset terminal (RESET) and receives an output signal of the shift register at a next stage, and a source of M2 is connected to a low-voltage signal terminal (VSS) and receives a low-voltage signal; a drain of M3 is connected to a clock signal terminal, a gate of M3 is connected to the source of M1, and a source of M3 serves as a signal output terminal (OUTPUT) of the shift register at the present stage; a drain of M4 is connected to the source of M3, a gate of M4 is connected to the reset terminal (RESET), and a drain of M4 is connected to the low-voltage signal terminal (VSS); one terminal of C1 is connected respectively to the source of M1 and the gate of M3, and the other terminal of C1 is connected to the source of M3; the pull-down unit PD is not only in parallel with C1, but also one terminal thereof is connected to the low-voltage signal terminal (VSS), and another terminal is connected to the drain of M3.

The operational principle of the aforementioned gate driving circuit is: when an input signal at INPUT is at a high level, M1 is turned on, and a node PU is charged; when a clock signal at the clock signal terminal is at the high level, M3 is turned on, the pulse of the clock signal is outputted at OUTPUT, and at the same time the node PU is further pulled up due to bootstrapping of C1; thereafter M2 and M4 are turned on by a reset signal at RESET, so as to discharge the node PU and OUTPUT. Next, the circuit devices of the pull-down unit PD are controlled by the clock signal to discharge the node PU and OUTPUT, ensuring that there will be no noise occurring in the line corresponding to the shift register at the present stage during the non-operating time, the specific timing sequence of respective signals being as shown in FIG. 2. In normal circumstances, when the shift register shown in FIG. 1 is applied, at the instant of TFT being turned off, the signal at OUTPUT jumps from the high level to a low level, and the voltage jump of the pixel is large, thus affecting the picture quality of LCD.

In normal circumstances, it may be considered to add the function of a multi-level gate (MLG) to the gate driving circuit, so as to reduce the voltage jump and improve the picture quality. The generation principle of MLG is to draw a feedback signal from the output terminal to DC/DC IC and subsequently to generate a voltage and output it.

However, α-Si process is typically adopted in the existing gate driving circuit. Considering the mobility of TFT in the α-Si process under a low-temperature condition will drop by about half compared to that under a high-temperature condition, therefore, in order to avoid the situation of failure occurring when the gate driving circuit is in the low-temperature condition, a solution of adding a temperature compensation circuit outside of the gate driving circuit is usually adopted, and particularly a thermo-sensitive device can be connected in parallel with the feedback circuit generating the gate high level Vgh to cause Vgh to rise with the temperature falling down.

However, once the effectiveness of the gate driving circuit is guaranteed by way of using temperature compensation, the voltage of Vgh may rise to more than 30V, while DC/DC IC cannot withstand such a high voltage, and in this case the function of MLG will be deactivated. Once the function of MLG is deactivated, there will be a large voltage jump at the instant of TFT being turned off, thus affecting the picture quality of TFT panel.

SUMMARY

In view of this, the main object of the present disclosure is to provide a gate driving circuit, a gate driving method and a display that can realize a gate driving circuit having a MLG function.

An embodiment of the present disclosure provides a gate driving circuit, including a plurality of shift registers at a plurality of stages, wherein the shift register at each stage includes a pull-up driving unit, a pull-up unit, a reset unit and a pull-down unit, said shift register further including: a supplementary unit; wherein, said pull-up unit is used for making a clock signal at a first clock terminal an output signal of the shift register at the present stage when being turned on;

said supplementary unit, connected to said pull-up unit, is used for making a clock signal at a second clock terminal the output signal of the shift register at the present stage when being turned on.

In one example, said pull-up driving unit, connected to an input node of the pull-up unit, is used for controlling ON and OFF of the pull-up unit.

In one example, said pull-up driving unit comprises a first TFT switching device and a second TFT switching device; wherein, a drain and a gate of the first TFT switching device are connected to an output terminal of the shift register at a previous stage;

a drain of said second TFT switching device is connected to the source of said first TFT switching device, a gate of said second TFT switching device is connected to an output terminal of the shift register at a next stage, and a source of said second TFT switching device is connected to a low level.

In one example, said pull-up unit includes a third TFT switching device and a boost device; Wherein, a drain of said third TFT switching device is connected to the first clock terminal, a gate of said third TFT switching device is connected to the source of said first TFT switching device, and a source of said third TFT switching device is an output terminal of the shift register at the present stage;

the boost device has a first terminal respectively connected to the source of said first TFT switching device and the gate of said third TFT switching device and a second terminal connected to the source of said third TFT switching device.

In one example, said reset unit includes a fourth TFT switching device; a drain of said fourth TFT switching device is connected to the source of the third TFT switching device, a gate of said fourth TFT switching device is connected to the output terminal of the shift register at the next stage, and a source of said fourth TFT switching device is connected to the low level.

In one example, said supplementary unit includes a fifth TFT switching device and a sixth TFT switching device; wherein, a drain and a gate of the fifth TFT switching device are connected to the second clock terminal, a drain of the sixth TFT switching device is connected to the source of the fifth TFT switching device, a gate of the sixth TFT switching device is connected to the source of the first TFT switching device of said pull-up driving unit, and a source of the sixth TFT switching device is connected to the output terminal of said pull-up unit and meanwhile serves as the output terminal of the shift register at the present stage.

In one example, said fifth switching device and said sixth TFT switching device are metal-oxide-semiconductor field effect transistors.

In one example, the clock signal at said second clock terminal jumps into its high level at the instant of the clock signal at the first clock terminal becoming the low level.

An embodiment of the invention provides a liquid crystal display comprising the gate driving circuit as described above.

An embodiment of the invention also provides a gate driving method comprising:

turning on the pull-up driving unit and beginning to charge the shift register at the present stage when the output signal at the output terminal of the shift register at the previous stage is at a high level;

turning on the pull-up unit and making the clock signal at the first clock terminal the output signal of the shift register at the present stage when the clock signal at the first clock terminal is at its high level and the clock signal at the second clock terminal is at the low level;

the clock signal at said first clock terminal jumping into the low level and the clock signal at said second clock terminal jumping into its high level, turning on the supplementary unit and making the clock signal at said second clock terminal the output signal of the shift register at the present stage.

In one example, the high level of the clock signal at said second clock terminal is lower than the high level of the clock signal at said first clock terminal.

With the supplementary unit of the shift register at each stage in the gate driving circuit, the present disclosure controls the output of the shift register through turning on the supplementary unit at the instant of the TFT being turned off, which is possible to reduce the voltage jump of the pixel, achieve the MLG function and enhance the picture quality of the LCD.

Explanation of Symbols: M1—a first TFT switching device; M2—a second TFT switching device; M3—a third TFT switching device; M4—a fourth TFT switching device; M5—a fifth TFT switching device; M6—a sixth TFT switching device; PD—a pull-down unit; C1—a boost device; 31—a GOA circuit unit; 32—a supplementary unit.

DETAILED DESCRIPTION

In order for those skilled in the art understanding the technical solution sought for protection in the present disclosure, the gate driving circuit and method and the liquid crystal display provided in the embodiments of the present disclosure will be described with reference to the accompanying drawings. Obviously, the embodiments given in the present application are only some but not all of the embodiments of the present disclosure, and all other embodiments obtained by those skilled in the art without paying any creative labor shall fall within the protection scope of the present disclosure.

The basic idea of embodiments of the present invention is: said gate driving circuit includes shift registers at a plurality of stages, wherein the shift register at each stage includes a pull-up driving unit, a pull-up unit, a reset unit, a pull-down unit, and further comprises: a supplementary unit; wherein said pull-unit is used for making a clock signal at a first clock terminal an output signal of the shift register at the present stage when being turned on; said supplementary unit is connected to said pull-up unit and is used for making a clock signal at a second clock terminal the output signal of the shift register at the present stage when being turned on.

In order that the object, technical solution and advantages of the present disclosure become clearer, the present disclosure is described in further detail by illustrating the following examples with reference to the accompanying drawings.

Figure 1:
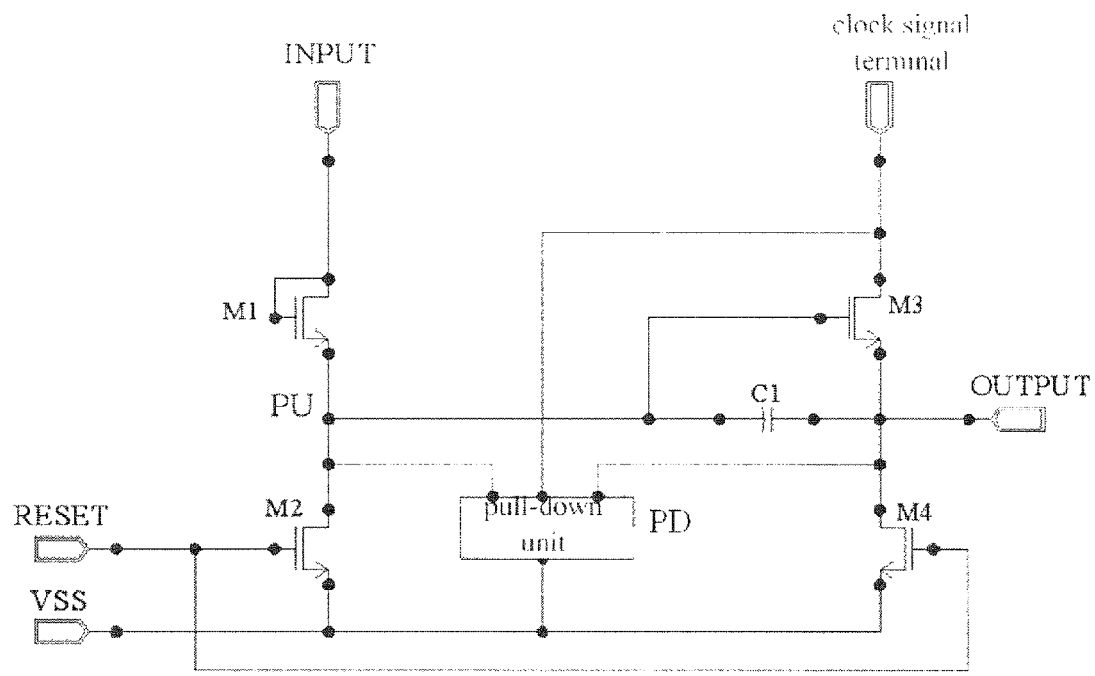
FIG. 1 is a schematic structure diagram of a shift register at each stage in the existing gate driving circuit.
Figure 2:
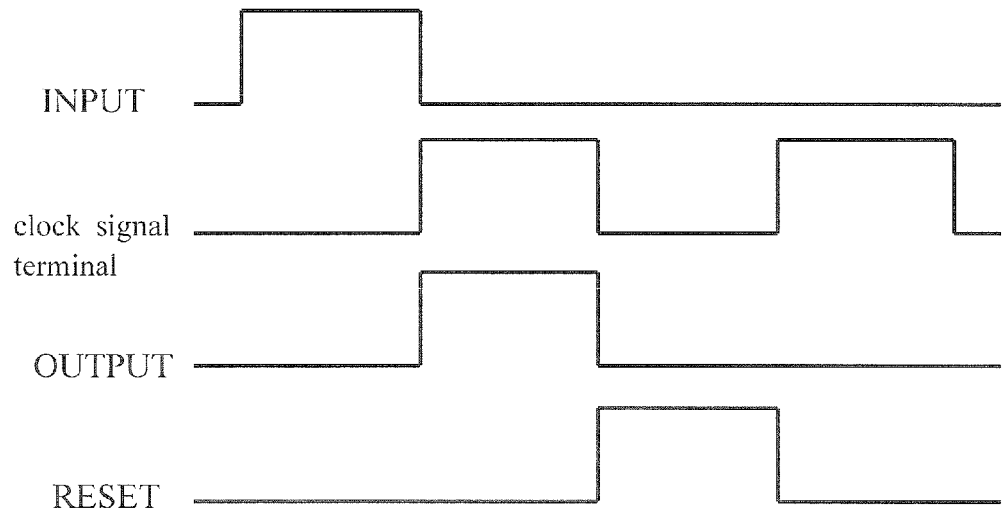
FIG. 2 is a timing diagram of input and output signals of a shift register in the existing gate driving circuit as shown in FIG. 1.
Figure 3:
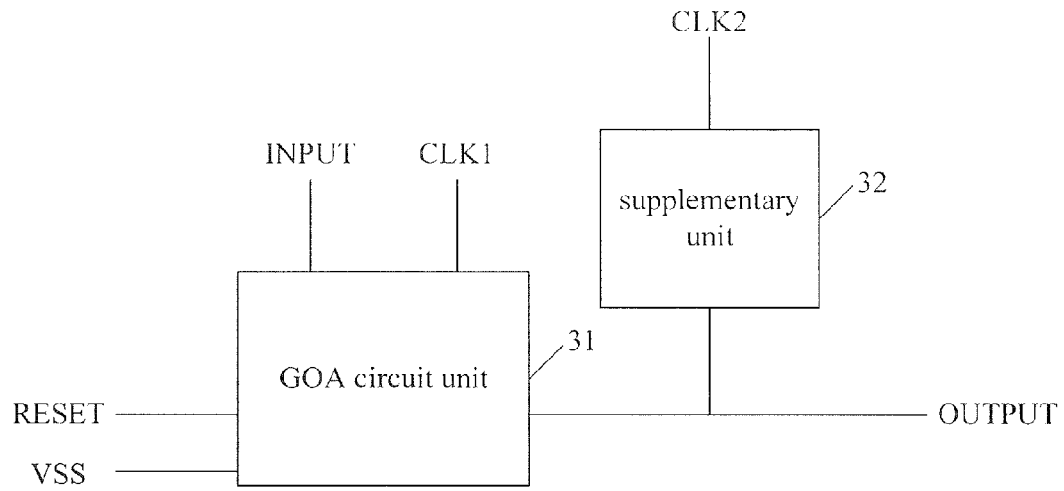
FIG. 3 is a schematic diagram of the function structure of a shift register in the gate driving circuit according to an embodiment of the present invention.

FIG. 3 illustrates the functional configuration of the shift register of each stage in the gate driving circuit of the present disclosure, and as shown in FIG. 3, the shift register comprises a GOA circuit unit 31 and a supplementary unit 32; wherein the GOA circuit unit 31 is connected to an input terminal (INPUT), a reset terminal (RESET), a first clock terminal (CLK1) and a low-voltage signal terminal (VSS), said input terminal (INPUT) receives an output signal of the shift register at a previous stage, said reset terminal (RESET) receives an output signal of the shift register at a next stage, said low signal terminal (VSS) receives a low-voltage signal, and under normal circumstances, a voltage level of said low signal terminal (VSS) is the same as a low level of a clock signal at CLK1; the supplementary unit 32 is connected to a second clock terminal (CLK2) and an output terminal (OUTPUT) of the GOA circuit unit 31 respectively, and is used for controlling the output of the GOA circuit unit 31.

The specific operating process of the above-mentioned shift register is: when the clock signal at CLK1 is at its high level, the clock signal at CLK2 is at a low level, the output signal at OUTPUT is the pulse signal at CLK1, and the voltage value at that time is referred to as Vgh1; when the clock signal at CLK1 becomes the low level, the clock signal at CLK2 of the supplementary unit 32 turns into its high level, at this time the supplementary unit 32 is turned on, the output signal at OUTPUT is the pulse signal at CLK2, and the voltage value at that time is referred to as Vgh2 In view of the overall situation, the output voltage value at OUTPUT jumps from Vgh1 to Vgh2, which, relative to the shift register of the existing gate driving circuit directly jumping from Vgh1 to 0, greatly reduces the jump voltage of the pixel, thereby achieving the MLG function and enhancing the picture quality.

Figure 4:
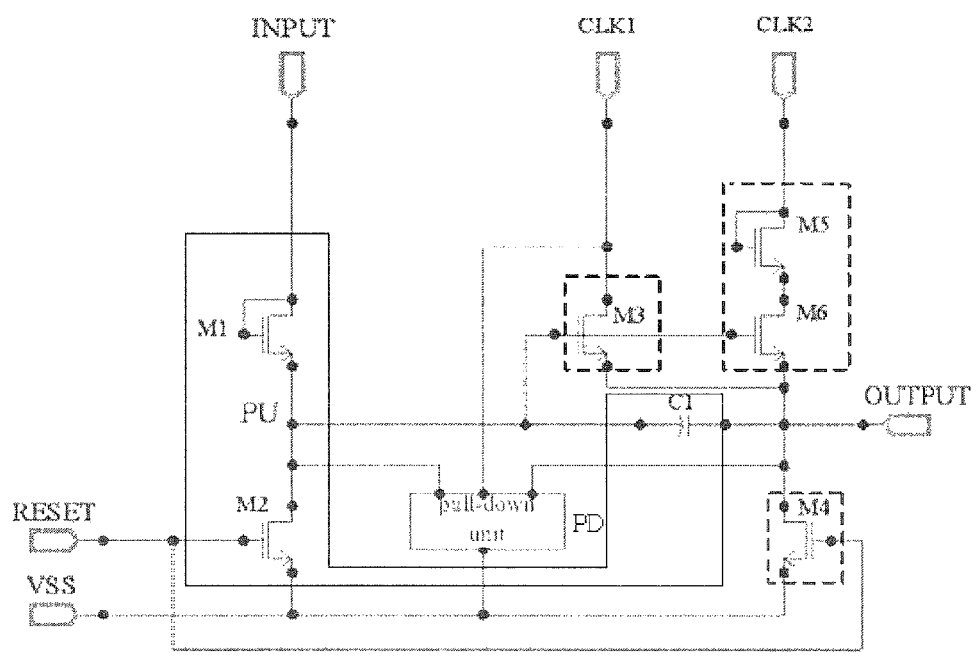
FIG. 4 is a structure diagram of a specific implementation of a shift register in the gate driving circuit according to an embodiment of the present invention.

FIG. 4 shows a specific implementation structure of the shift register of the gate driving circuit according to an embodiment of the present disclosure, and as shown in FIG. 4, the aforesaid GOA circuit unit 31 includes a pull-up driving unit, a pull-up unit, a reset unit, a pull-down unit and a supplementary unit, wherein said pull-unit is used for making the clock signal at a first clock terminal the output signal of the shift register at the present stage when being turned on; said supplementary unit is connected to said pull-up unit and is used for making the clock signal at the second clock terminal the output signal of the shift register at the present stage when being turned on.

Wherein, said pull-up driving unit, connected to an input node of the pull-up unit, is used for controlling ON and OFF of the pull-up unit.

In one example, said pull-up driving unit further comprises a first TFT switching device M1 and a second TFT switching device M2;

said pull-up unit includes a third TFT switching device M3 and a boost device C1;

a drain and a gate of said M1 are connected to the INPUT; a drain of said M2 is connected to a source of said M1, a gate of said M2 is connected to the RESET, and a source of said M2 is connected to the VSS; a drain of said M3 is connected to the CLK1, a gate of said M3 is connected to the source of said M1, and a source of said M3 is the output terminal of said GOA circuit unit 31 and also the output terminal of the shift register at the present stage; said C1 has a first terminal connected to the source of said M1 and the gate of said M3 and a second terminal connected to the source of the M3.

In one example, further, said reset unit specifically includes a fourth TFT switching device M4; a drain of said M4 is connected to the source of the M3, a gate of said M4 is connected to RESET, and a source of said M4 is connected to VSS.

In one example, further, the GOA circuit unit 31 also includes: a pull-down unit PD, connected in parallel with the C1, has a first terminal connected to the VSS and a second terminal connected to the drain of said M3.

In one example, the above-mentioned supplementary unit 32 specifically includes a fifth TFT switching device M5 and a sixth TFT switching devices M6; wherein a drain and a gate of said M5 are connected to CLK2, a drain of the M5 is connected to a source of the M5, a gate of the M6 is connected to the first terminal of C1 in the pull-up driving unit of the GOA circuit unit 31, and a source of the M6 is connected the output terminal of the pull-up unit, i.e. the source of the M3, and also serves as the output terminal of the shift register at the present stage.

Wherein, the above-mentioned M1, M2, M3, M4, M5 and M6 specifically can be metal-oxide-semiconductor (MOS) field effect transistors.

The specific operating process of said gate driving circuit is: when the input signal at INPUT is at its high level, the M1 is turned on and the node PU is charged; when the clock signal at CLK1 is at its high level and the clock signal at CLK2 is a low level, the M3 is turned on, at this time the output signal at OUTPUT is the pulse signal at CLK1, the voltage value at this time is referred to as Vgh1, and meanwhile a first bootstrapping function of C1 pulls up the node PU for the first time. Then, when the clock signal at CLK1 turns into the low level, the clock signal at CLK2 of the supplementary unit 32 turns into its high level and lasts a short time, at this time M5 and M6 are turned on, the output signal at OUTPUT is the pulse signal at CLK2, the voltage value at this time is referred to as Vgh2, a second bootstrapping function of C1 pulls up the node PU once again. In view of the overall situation, the output voltage value at OUTPUT jumps from Vgh1 to Vgh2, which, relative to the shift register of the existing gate driving circuit directly jumping from Vgh1 to 0, greatly reduces the jump voltage of the pixel, thereby achieving the MLG function and enhancing the picture quality. Then, the node PU and OUTPUT are discharged by CLK1 controlling the pull-down unit PD, thereby guaranteeing that the shift register of the gate driving circuit will not produce noise in the non-operating time.

Figure 5:
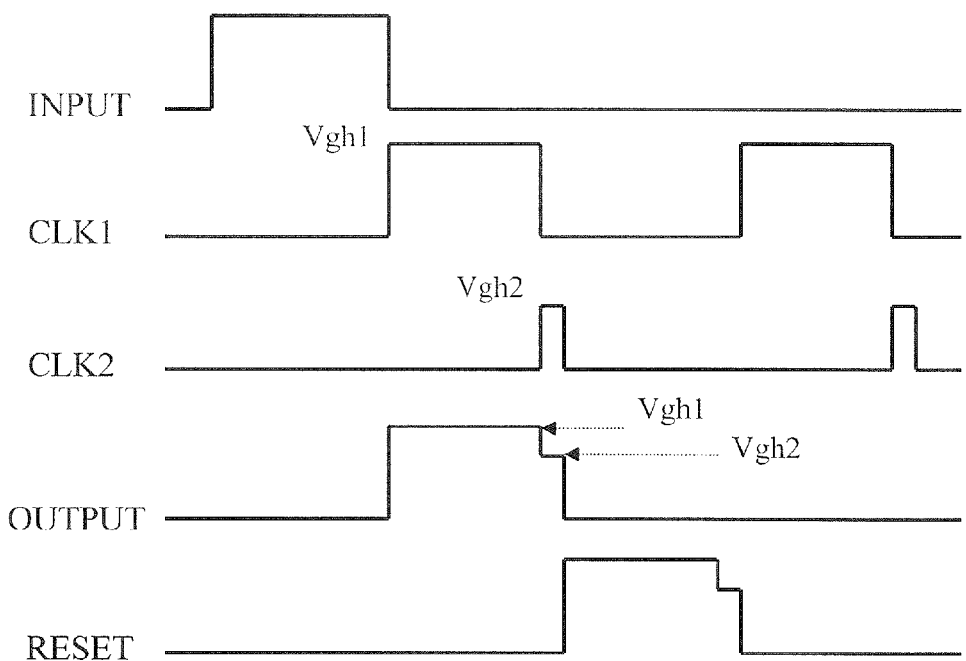
FIG. 5 is a timing diagram of input and output signals of a shift register in the gate driving circuit according to an embodiment of the present invention.

Specifically, during the above process, the timing diagrams of the respective input and output signals can refer to FIG. 5. As can be seen from FIG. 5, the voltage value of CLK2 Vgh2 is lower that of CLK1 Vgh1. It should be understood that the input signal at the INPUT in FIG. 5 is illustrated by the output signal of the shift register at the previous stage of the existing gate driving circuit, and when the gate driving circuit according to the embodiment of the present disclosure is particularly used, the timing diagram of the input signal at the INPUT is the output signal of the shift register at the previous stage of the gate driving circuit according to the embodiment of the present invention.

Figure 6:
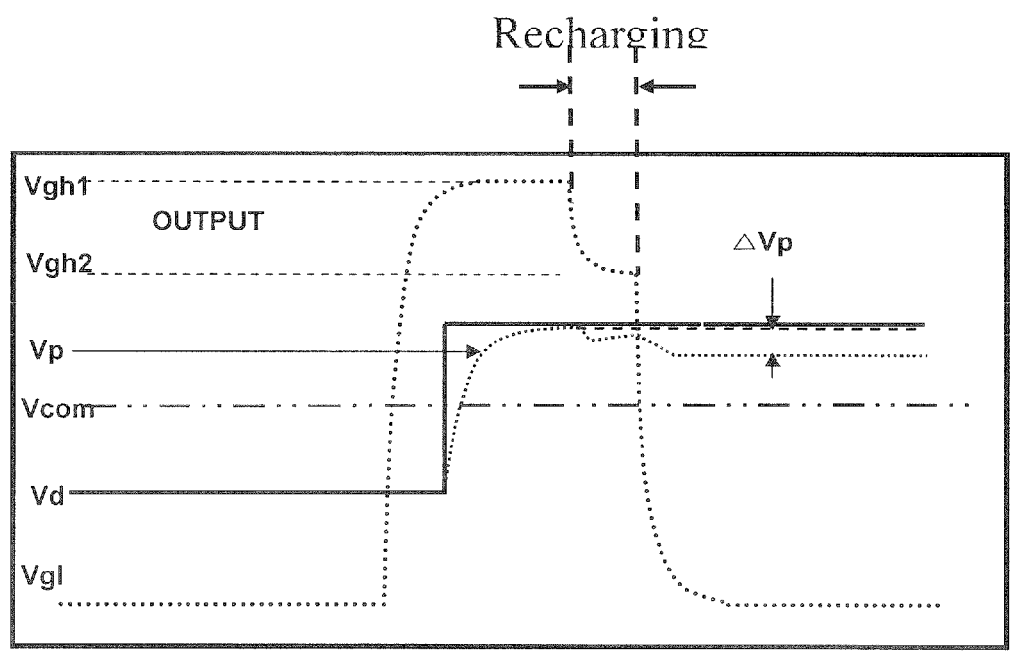
FIG. 6 is a schematic principle diagram of the MLG function being implemented by the gate driving circuit according to an embodiment of the present invention.

FIG. 6 shows the principle of the MLG function achieved by the gate driving circuit according to the embodiment of the present disclosure. As shown in FIG. 6, at the instant of CLK1 turning into a low level, i.e. at the instant of TFT being turned off, OUTPUT will also turn into the low level, however, since there is an input from CLK2, the value of the output voltage at OUTPUT at this time is Vgh2 and at this time a recharging will occur, thereby achieving an effect of reducing the jump voltage ΔVp of pixel, and then enhancing the picture quality; wherein Vp in FIG. 6 is the voltage waveform of the pixel, Vcom is the voltage of a common electrode, Vd is the voltage waveform of a data line (Data), and Vg1 is the low level of the gate.

Embodiments of the disclosure further provide a liquid crystal display, wherein said liquid crystal display comprises the gate driving circuit as described above.

Figure 7:
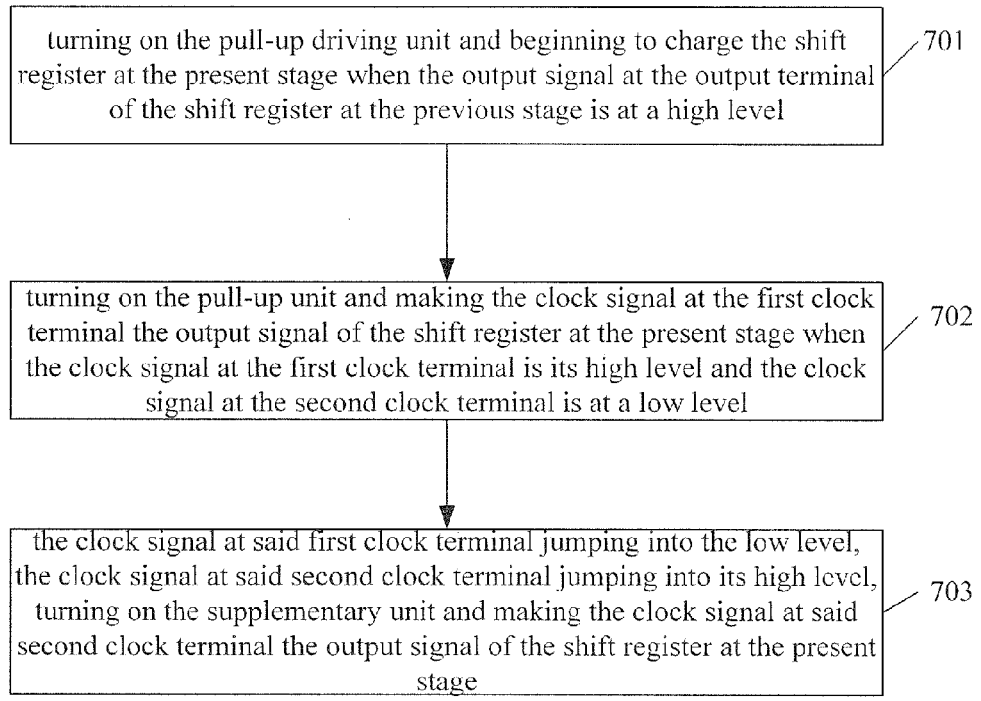
FIG. 7 is a schematic flowchart of the gate driving method according to an embodiment of the present invention.

Embodiments of the present disclosure also provide a gate driving method implemented by taking advantage of the aforesaid gate driving circuit, and the implementation flow of said method can refer to FIG. 7, comprising:

Step 701, turning on the pull-up driving unit and beginning to charge the shift register at the present stage when the output signal at the output terminal of the shift register at the previous stage is at a high level;

Step 702, turning on the pull-up unit and making the clock signal at the first clock terminal the output signal of the shift register at the present stage when the clock signal at the first clock terminal is its high level and the clock signal at the second clock terminal is at a low level;

Step 703, the clock signal at said first clock terminal jumping into the low level, the clock signal at said second clock terminal jumping into its high level, turning on the supplementary unit and making the clock signal at said second clock terminal the output signal of the shift register at the present stage.

Wherein, the high level of the clock signal at said second clock terminal is lower than the high level of the clock signal at said first clock terminal. Wherein, the difference between the high level of the clock signal at said second clock terminal and that of the clock signal at said first clock terminal is determined according to the specific situation of the actual application.

Description above is only the preferred embodiment of the present invention, but not intended to limit the protection scope of the present invention. It is possible for an ordinary skilled person in the art to make various variations and modifications without departing from the spirit and substance of the present invention, and these variations and modifications are also considered as the protection scope of the present invention.

What is claimed is:

1. A gate driving circuit comprising shift registers at a plurality of stages, wherein the shift register at each stage including a pull-up driving unit, a pull-up unit, a reset unit and a pull-down unit, said shift register further including: a supplementary unit; wherein,
    said pull-up unit is connected to an output terminal of the shift register at a present stage and is used for making a clock signal at a first clock terminal an output signal at the output terminal when being turned on;
    said supplementary unit is connected to the output terminal of the shift register at the present stage, and is used for making a clock signal at a second clock terminal the output signal at the output terminal when being turned on;
    said pull-down unit is connected to the output terminal of the shift register at the present stage, and is used for making a low level at a low voltage signal terminal the output signal at the output terminal when being turned on,
    wherein a first voltage corresponding to a high level of the clock signal at the first clock terminal is higher than a second voltage corresponding to a high level of the clock signal at the second clock terminal, such that the output signal at the output terminal of the shift register at the present stage lumps from the first voltage to the second voltage and then to the low level at the low voltage signal terminal.

2. The gate driving circuit according to claim 1, wherein said pull-up driving unit, connected to an input node of the pull-up unit, is used for controlling ON and OFF of the pull-up unit.

3. The gate driving circuit according to claim 2, wherein said pull-up driving unit includes a first TFT switching device and a second TFT switching device; wherein,
    a drain and a gate of the first TFT switching device are connected to an output terminal of the shift register at the present stage;
    a drain of said second TFT switching device is connected to the source of said first TFT switching device, a gate of said second TFT switching device is connected to an output terminal of the shift register at a next stage, and a source of said second TFT switching device is connected to a low level.

4. The gate driving circuit according to claim 3, wherein said pull-up unit includes a third TFT switching device and a boost device; wherein,
    a drain of said third TFT switching device is connected to the first clock terminal, a gate of said third TFT switching device is connected to the source of said first TFT switching device, and a source of said third TFT switching device is connected to an output terminal of the shift register at the present stage;
    said boost device has a first terminal respectively connected to the source of said first TFT switching device and the gate of said third TFT switching device and a second terminal connected to the source of said third TFT switching device.

5. The gate driving circuit according to claim 4, wherein said reset unit includes a fourth TFT switching device; a drain of said fourth TFT switching device is connected to the source of the third TFT switching device, a gate of said fourth TFT switching device is connected to the output terminal of the shift register at the next stage, and a source of said fourth TFT switching device is connected to a low level.

6. The gate driving circuit according to claim 5, wherein said supplementary unit includes a fifth TFT switching device and a sixth TFT switching device; wherein,
    a drain and a gate of the fifth TFT switching device are connected to the second clock terminal, a drain of the sixth TFT switching device is connected to a source of the fifth TFT switching device, a gate of the sixth TFT switching device is connected to the source of the first TFT switching device of said pull-up driving unit, and a source of the sixth TFT switching device is connected to the output terminal of said pull-up unit and also serves as the output terminal of the shift register at the present stage.

7. The gate driving circuit according to claim 6, wherein said fifth switching device and said sixth TFT switching device are metal-oxide-semiconductor field effect transistors.

8. The gate driving circuit according to claim 6, wherein the clock signal at said second clock terminal jumps into its high level at the instant of the clock signal at the first clock terminal becoming the low level.

9. A liquid crystal display comprising a gate driving circuit comprising shift registers at a plurality of stages, wherein the shift register at each stage including a pull-up driving unit, a pull-up unit, a reset unit and a pull-down unit, said shift register further including: a supplementary unit; wherein,
    said pull-up unit is connected to an output terminal of the shift register at a present stage and is used for making a clock signal at a first clock terminal an output signal at the output terminal when being turned on;
    said supplementary unit is connected to the output terminal of the shift register at the present stage, and is used for making a clock signal at a second clock terminal the output signal at the output terminal when being turned on;
    said pull-down unit is connected to the output terminal of the shift register at the present stage, and is used for making a low level at a low voltage signal terminal the output signal at the output terminal when being turned on,
    wherein a first voltage corresponding to a high level of the clock signal at the first clock terminal is higher than a second voltage corresponding to a high level of the clock signal at the second clock terminal, such that the output signal at the output terminal of the shift register at the present stage lumps from the first voltage to the second voltage and then to the low level at the low voltage signal terminal.

10. The liquid crystal display according to claim 9, wherein said pull-up driving unit, connected to an input node of the pull-up unit, and includes a first TFT switching device and a second TFT switching device; wherein,
   a drain and a gate of the first TFT switching device are connected to an output terminal of the shift register at the present stage;
   a drain of said second TFT switching device is connected to the source of said first TFT switching device, a gate of said second TFT switching device is connected to an output terminal of the shift register at a next stage, and a source of said second TFT switching device is connected to a low level.

11. The liquid crystal display according to claim 10, wherein said pull-up unit includes a third TFT switching device and a boost device; wherein,
   a drain of said third TFT switching device is connected to the first clock terminal, a gate of said third TFT switching device is connected to the source of said first TFT switching device, and a source of said third TFT switching device is connected to an output terminal of the shift register at the present stage;
   said boost device has a first terminal respectively connected to the source of said first TFT switching device and the gate of said third TFT switching device and a second terminal connected to the source of said third TFT switching device.

12. The liquid crystal display according to claim 11, wherein said reset unit includes a fourth TFT switching device; a drain of said fourth TFT switching device is connected to the source of the third TFT switching device, a gate of said fourth TFT switching device is connected to the output terminal of the shift register at the next stage, and a source of said fourth TFT switching device is connected to a low level.

13. The liquid crystal display according to claim 12, wherein said supplementary unit includes a fifth TFT switching device and a sixth TFT switching device; wherein,
   a drain and a gate of the fifth TFT switching device are connected to the second clock terminal, a drain of the sixth TFT switching device is connected to a source of the fifth TFT switching device, a gate of the sixth TFT switching device is connected to the source of the first TFT switching device of said pull-up driving unit, and a source of the sixth TFT switching device is connected to the output terminal of said pull-up unit and also serves as the output terminal of the shift register at the present stage.

14. The liquid crystal display according to claim 13, wherein the clock signal at said second clock terminal jumps into its high level at the instant of the clock signal at the first clock terminal becoming the low level.

15. A gate driving method for a gate driving circuit comprising shift registers at a plurality of stages, wherein the shift register at each stage including a pull-up driving unit, a pull-up unit, a reset unit and a pull-down unit, said shift register further including: a supplementary unit; wherein,
   said pull-up unit is connected to an output terminal of the shift register at a present stage and is used for making a clock signal at a first clock terminal an output signal at the output terminal when being turned on;
   said supplementary unit is connected to the output terminal of the shift register at the present stage, and is used for making a clock signal at a second clock terminal the output signal at the output terminal when being turned on;
   said pull-down unit is connected to the output terminal of the shift register at the present stage, and is used for making a low level at a low voltage signal terminal the output signal at the output terminal when being turned on,
   the gate driving method comprising:
   turning on the pull-up driving unit and beginning to charge the shift register at the present stage when the output signal at the output terminal of the shift register at a previous stage is at a high level;
   turning on the pull-up unit and making the clock signal at the first clock terminal the output signal of the shift register at the present stage when the clock signal at the first clock terminal is at its high level and the clock signal at the second clock terminal is at a low level;
   the clock signal at said first clock terminal jumping into the low level, the clock signal at said second clock terminal jumping into its high level, turning on the supplementary unit and making the clock signal at said second clock terminal the output signal of the shift register at the present stage,
   wherein a first voltage corresponding to the high level of the clock signal at the first clock terminal is higher than a second voltage corresponding to the high level of the clock signal at the second clock terminal, such that the output signal at the output terminal of the shift register at the present stage lumps from the first voltage to the second voltage and then to the low level at the low voltage signal terminal.

16. The gate driving method according to claim 15, wherein the high level of the clock signal at said second clock terminal is lower than the high level of the clock signal at said first clock terminal.

17. The liquid crystal display according to claim 15, wherein said pull-up driving unit, connected to an input node of the pull-up unit, and includes a first TFT switching device and a second TFT switching device; wherein,
   a drain and a gate of the first TFT switching device are connected to an output terminal of the shift register at the present stage;
   a drain of said second TFT switching device is connected to the source of said first TFT switching device, a gate of said second TFT switching device is connected to an output terminal of the shift register at a next stage, and a source of said second TFT switching device is connected to a low level.

18. The liquid crystal display according to claim 17, wherein said pull-up unit includes a third TFT switching device and a boost device; wherein,
   a drain of said third TFT switching device is connected to the first clock terminal, a gate of said third TFT switching device is connected to the source of said first TFT switching device, and a source of said third TFT switching device is an output terminal of the shift register at the present stage;
   said boost device has a first terminal respectively connected to the source of said first TFT switching device and the gate of said third TFT switching device and a second terminal connected to the source of said third TFT switching device.

19. The liquid crystal display according to claim 18, wherein said reset unit includes a fourth TFT switching device; a drain of said fourth TFT switching device is connected to the source of the third TFT switching device, a gate of said fourth TFT switching device is connected to the output terminal of the shift register at the next stage, and a source of said fourth TFT switching device is connected to a low level.

20. The liquid crystal display according to claim 19, wherein said supplementary unit includes a fifth TFT switching device and a sixth TFT switching device; wherein, a drain and a gate of the fifth TFT switching device are connected to the second clock terminal, a drain of the sixth TFT switching device is connected to a source of the fifth TFT switching device, a gate of the sixth TFT switching device is connected to the source of the first TFT switching device of said pull-up driving unit, and a source of the sixth TFT switching device is connected to the output terminal of said pull-up unit and also serves as the output terminal of the shift register at the present stage.

* * * * *